United States Patent
Dike et al.

(10) Patent No.: US 8,760,208 B2
(45) Date of Patent: Jun. 24, 2014

(54) LATCH WITH A FEEDBACK CIRCUIT

(75) Inventors: Charles E. Dike, Hillsboro, OR (US);
Mark E. Schuelein, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 43 days.

(21) Appl. No.: 13/436,106

(22) Filed: Mar. 30, 2012

(65) Prior Publication Data

US 2013/0257493 A1 Oct. 3, 2013

(51) Int. Cl.
*H03K 3/356* (2006.01)

(52) U.S. Cl.
USPC ........... 327/212; 327/208; 327/218; 327/225; 326/94; 326/95

(58) Field of Classification Search
USPC ......... 327/199–203, 208–212, 214, 215, 218, 327/219, 223, 225; 326/93–98
See application file for complete search history.

(56) References Cited

U.S. PATENT DOCUMENTS

| 5,789,945 | A | 8/1998 | Cline | |
|---|---|---|---|---|
| 6,989,695 | B2 * | 1/2006 | Dike et al. | 327/142 |
| 7,944,769 | B1 * | 5/2011 | Lesea | 365/226 |
| 8,330,517 | B1 * | 12/2012 | Cline | 327/203 |

FOREIGN PATENT DOCUMENTS

JP 09214298 A * 8/1997 ............. H03K 3/037

OTHER PUBLICATIONS

Michael Kayam, Ran Ginosar and Charles E. Dike, Symmetric Boost Synchronizer for Robust Low Voltage, Low Temperature Operation. IEEE Journal of Solid-State Circuits, Jan. 25, 2007, US.

* cited by examiner

*Primary Examiner* — Patrick O'Neill
(74) *Attorney, Agent, or Firm* — Schwabe Williamson & Wyatt, P.C.

(57) ABSTRACT

An apparatus may include a storage circuit that may have a first terminal and a second terminal and may have two cross-coupled inverters. The apparatus may include a feedback circuit coupled to the first terminal. The feedback circuit may include electronic logic elements to determine if the storage circuit is in a metastable state. The feedback circuit may couple at least one of the first and second terminals to one of a voltage reference and a voltage source if determined that the storage circuit is in a metastable state.

19 Claims, 5 Drawing Sheets

LATCH WITH A FEEDBACK CIRCUIT

TECHNICAL FIELD

The present disclosure relates generally to electronic circuits. In particular, but not exclusively, the present disclosure relates to a latch with a feedback circuit.

BACKGROUND INFORMATION

A latch may be a level-triggered circuit that may drive an output terminal according to one of multiple stable output states. For example, a latch may drive an output terminal to match a voltage level of an input terminal while an input clock is logic level HIGH. The latch may then maintain the voltage level at the output terminal while the input clock is logic level LOW, independent of the voltage level of the input terminal.

A latch may become unstable or metastable and generate a voltage that is between defined stable states for the latch. The latch may become metastable for a number of reasons. For example, the latch may become metastable if a set up time is violated. The latch may be metastable if a hold time is violated. Various factors may aggravate latch metastability, such as low temperature conditions (e.g., 0° C.), low voltage conditions (e.g., 50% of maximum $V_{DD}$), or other slow semiconductor process corners. Without assistance, a latch may remain metastable indefinitely, or until random noise causes the latch to favor one stable state over another.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

Figure 1:
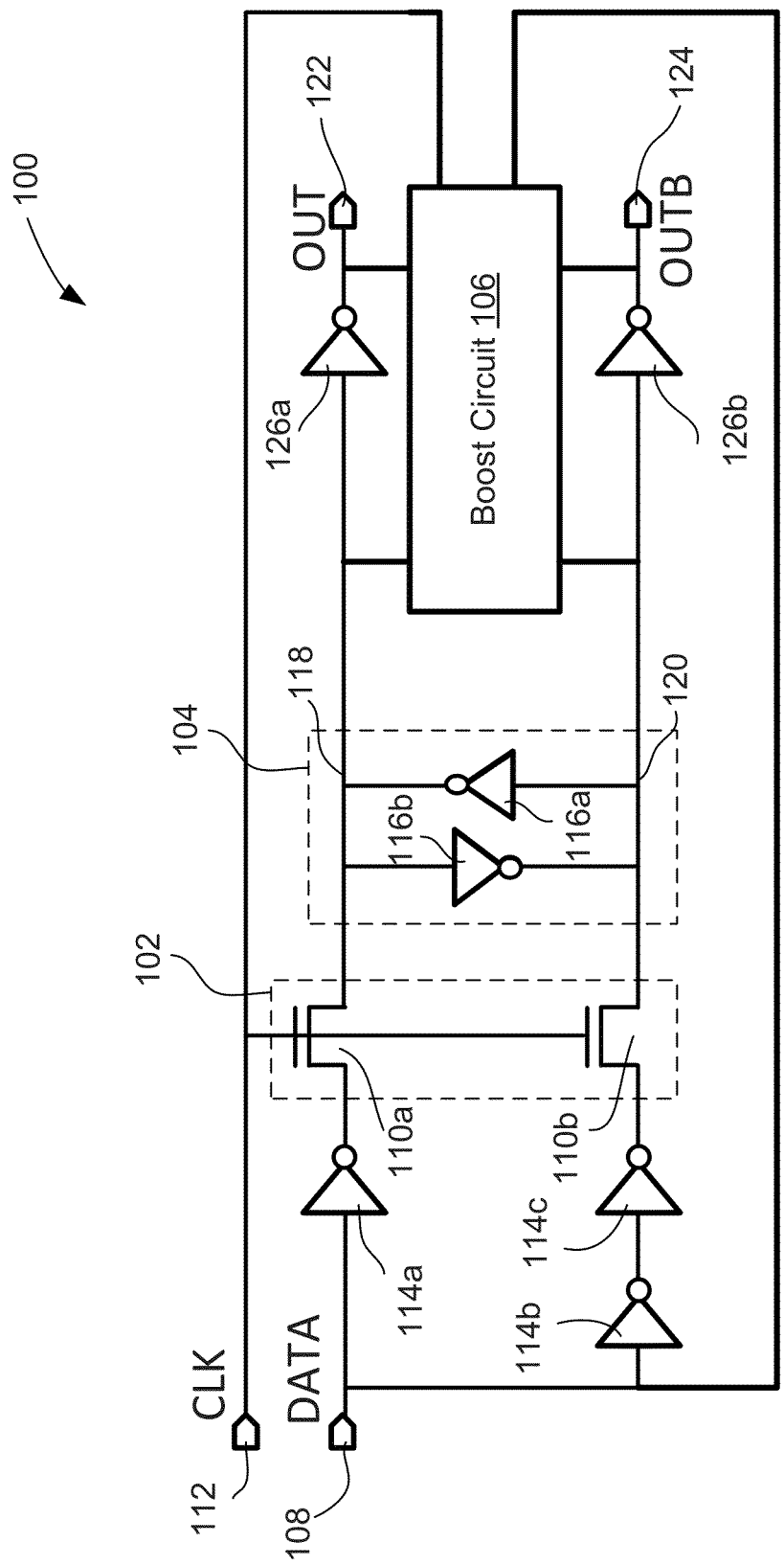
FIG. 1 is a schematic diagram of a latch with a boost circuit, according to one embodiment.

Embodiments disclosed herein are directed towards a latch having a boost circuit. A boost circuit may enable a latch to resolve to a stable state from a metastable state by sourcing and/or sinking current at one or more latch terminals. While the boost circuit may decrease resolution time, the boost circuit may also increase overall power consumption or inefficiency of the latch. Power efficiency of a latch having a boost circuit may therefore be increased by selectively enabling and disabling the boost circuit. According to another embodiment, the boost circuit may be enabled based on one or more outputs of the latch circuit and a data signal. According to yet another embodiment, the boost circuit may be enabled based on one or more outputs of the latch circuit, a clock signal, and a data signal.

Various aspects of the illustrative embodiments will be described using terms commonly employed by those skilled in the art to convey the substance of their work to others skilled in the art. However, some alternate embodiments may be practiced using portions of the described aspects. For purposes of explanation, specific numbers, materials, and configurations are set forth in order to provide a thorough understanding of the illustrative embodiments. However, alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(B) or (A B)", that is, A is optional.

As used herein, a logic level HIGH may correspond to any one of a voltage in the range of 0.3 to 0.7 volts, 0.5 to 1 volts, 0.7 to 1.2 volts, 1 to 3 volts, 1 to 5 volts, 3 to 15 volts, or other voltage or other signal level. Additionally, a logic level LOW may correspond to any one of a voltage in the range of 0 to 0.5 volts, 0 to 0.3 volts, −0.5 to 0.4 volts, −15 to 0 volts, or other voltage or other signal level. Additionally, a switch that is turned ON is considered to be electrically conductive between at least two conductive terminals of the switch, and a switch that is turned OFF is considered to be electrically non-conductive between the terminals.

FIG. 1 illustrates a latch circuit 100 suitable for practicing various embodiments. Latch circuit 100 may receive a datum and may selectively change a voltage level of an output terminal to mirror the datum based on a clock signal. Latch circuits 100, 200, 300, and 400 (shown in FIGS. 1-4, respectively) may be used to synchronize a data signal with the clock signal and may thus operate as a synchronizer or synchronizer circuit.

As will be described in more detail below, latch circuit 100 may be configured to selectively enable a boost circuit to decrease a resolution time of the latch circuit 100. In other words, latch circuit 100 may selectively enable a boost circuit to increase current passing through portions of latch circuit 100 to cause latch circuit 100 to enter a stable state from a metastable state. As shown, latch circuit 100 may include an enable circuit 102, a storage circuit 104, and a boost circuit 106.

Enable circuit 102 may selectively couple and decouple a data terminal 108 to storage circuit 104, according to one embodiment. Enable circuit 102 may be positioned between data terminal 108 and storage circuit 104 to selectively pass one or more data signals DATA from data terminal 108 to storage circuit 104. According to various embodiments, enable circuit 102 may include one or more transistors 110a, 110b (collectively 110) that couple data terminal 108 to storage circuit 104. Transistors 110 may include N-channel metal oxide semiconductor field effect transistors (MOSFETs) and/or P-channel MOSFETs configured as pass gates. Transistors 110 may alternatively include N-channel MOSFETs and P-channel MOSFETs electrically coupled in parallel and configured as one or more transmission gates. Transistors 110 may be coupled to a clock terminal 112 and may turn ON and OFF in response to the voltage level of clock signal CLK at clock terminal 112. For example, transistors 110 (if embodied as N-channel MOSFETs) may be ON while clock signal CLK is logic level HIGH, and transistors 110 may be OFF while clock signal CLK is logic level LOW.

Enable circuit 102 may be coupled to data terminal 108 through one or more driver circuits. According to various embodiments, one or more inverters 114a, 114b, 114c (collectively 114), may drive, invert, and/or delay data signal DATA before data signal DATA is received at enable circuit 102. The one or more inverters 114 may be coupled to delay data signal DATA propagation by a first duration at a first terminal of enable circuit 102 and by a second duration at a second terminal of enable circuit 102. The second duration may be longer than the first duration in one embodiment.

Storage circuit 104 may store one or more data signals DATA received from data terminal 108 on corresponding one or more terminals. Storage circuit 104 may include inverters 116a, 116b (collectively 116), a storage terminal 118, and a storage terminal 120. Each inverter 116a and 116b may include transistors configured to selectively couple an inverter output to a voltage source or to a voltage reference (e.g., ground). Inverters 116 may be cross-coupled such that an input terminal of inverter 116a couples to an output terminal of inverter 116b, and an input terminal of inverter 116b couples to an output terminal of inverter 116a. According to one embodiment, the output terminal of inverter 116a couples to storage terminal 118, and the output terminal of inverter 116b couples to storage terminal 120. Based on the configuration of inverters 116, storage terminal 118 and storage terminal 120 may store data signal DATA and a data signal DATAB (where data signal DATAB may have an opposite logic level than data signal DATA). For example, inverters 116 may generate a logic level HIGH on storage terminal 118 and generate a logic level LOW on storage terminal 120, or vice-versa.

During stable operation, storage circuit 104 may drive each of storage terminals 118, 120 to a logic level HIGH or a logic level LOW. However, while in a metastable state, storage circuit 104 may drive each of storage terminals 118, 120 to a voltage level that is neither logic level HIGH nor logic level LOW. In other words, transistors within each of inverters 116a and 116b may attempt to concurrently drive storage terminals 118, 120 to a logic level HIGH and a logic level LOW, thus generating a voltage level that may be approximately one half the voltage level of the voltage source, e.g., ½ $V_{DD}$. An inverter that may be concurrently attempting to drive an output terminal to a logic level HIGH and a logic level LOW may be undesirable for at least two reasons. First, such an inverter may waste or deplete power supplies (e.g., batteries) because the inverter may be sinking current directly from the voltage source to ground (i.e., a voltage reference) to generate undesirable heat. Second, an inverter in a metastable state is not likely to generate an output that reflects the state of data signal DATA that was intended to be latched. As will be discussed in detail below, boost circuit 106 may be configured to decrease the duration of a metastable state, which may increase the power efficiency of latch circuit 100 and enable latch circuit 100 to continue normal operations. Furthermore, boost circuit 106 may use feedback to reduce the resolution time of latch circuit 100, e.g., reduce the duration of a metastable state, during low voltage and low temperature (e.g., 0° C.) operations to increase the operational thermal and electrical ranges of latch circuit 100.

While storage circuit 104 is illustrated and described as a jamb latch, other types of latches may be used. For example, storage circuit 104 may be a tri-stated latch. Also, set and reset logic may be placed in storage circuit 104 without interfering with the feedback function of boost circuit 106. In other embodiments, other cross-coupled gates such as NAND gates, NOR gates, complex gates, or combinations thereof may be used for storage circuit 104.

Output terminal 122 and output terminal 124 may be coupled to receive latched stored versions of data signal DATA and data signal DATAB from storage terminal 118 and 120, respectively. Output terminals 122, 124 may be coupled to one or more external circuits to provide output signals that may have been received at data terminal 108 and synchronized by clock signal CLK at clock terminal 112. According to one embodiment, output terminals 122, 124 are coupled to storage circuit 104 through one or more inverters 126a, 126b (collectively 126). An output signal OUT may be output by latch circuit 100 at output terminal 122, and an output signal OUTB may be output by latch circuit 100 at output terminal 124. Output signal OUTB may have a logic level that is opposite the logic level of output signal OUT.

Boost circuit 106 may be configured to selectively reduce the duration of a metastable state of storage circuit 104, according to various embodiments. Boost circuit 106 may be responsive to an output of storage circuit 104 and may use principles of feedback to reduce the duration of a metastable state of storage circuit 104. Boost circuit 106 may also be coupled to receive input from one or more of data input terminal 108, clock input terminal 112, and output terminals 122, 124. For example, boost circuit 106 may be coupled to receive and respond to one or more of clock signal CLK, data signal DATA, output signal OUT, and output signal OUTB. Boost circuit 106 may be coupled to storage circuit 104 at storage terminal 118, storage terminal 120, or at both of storage terminals 118, 120. Boost circuit 106 may be configured to determine whether storage circuit 104 may be in a metastable state based on inputs received from one or more of data input terminal 108, clock input terminal 112, and output terminals 122, 124. According to embodiments, storage circuit 104 may not actually be in a metastable state while boost circuit 106 determines that storage circuit 104 is in a metastable state. Boost circuit 106 may over-inclusively determine that storage circuit 104 may be in a metastable state, but boost circuit 106 may still provide power savings benefits by selectively coupling storage circuit 104 to one of a ground reference and a voltage supply. Boost circuit 106 may be configured to assist storage circuit 104 in transitioning to a stable state in response to determining that storage circuit 104 may be in a metastable state. For example, boost circuit 106 may selectively sink current concurrently from storage terminals 118, 120 in response to determining that storage circuit 104 may be in a metastable state. Boost circuit 106 may selectively sink current from storage terminals by coupling storage terminals 118, 120 to a voltage reference, such as ground. Concurrently sinking current from input terminals (e.g., storage terminals 118, 120) of both inverters 116 may be called symmetric boosting, as opposed to boosting one input/output terminal at a time. By concurrently sinking current from storage terminals 118, 120, boost circuit 106 increases the transconductance ($g_m$) of inverters 116. The increased transconductance ($g_m$) may increase the conductivity of respective channels of one or more transistors within inverters 116 to increase current flow through the transistors and cause the inverters to transition to a stable state sooner. According to one embodiment, boost circuit 106 may selectively inject current into storage terminals 118, 120 by coupling one or more storage terminals to the supply voltage, in response to determining that storage circuit 104 may be in a metastable state. According to another embodiment, boost circuit 106 may selectively couple one of storage terminals 118 and 120 to one of ground and the supply voltage, in response to determining that storage circuit 104 may be in a metastable state.

The time used by a latch to resolve from a metastable state to a stable state may be proportional to a time resolution constant, τ. The time resolution constant, τ may be approximated as:

$$\tau = C/g_m,$$

where C is the capacitance of an inverter (e.g., a transistor of the inverter) of the latch and $g_m$ is the transconductance of the inverter (e.g., a transistor of the inverter). Accordingly, increasing the transconductance ($g_m$) decreases the time resolution constant, τ, and thus the average time for an inverter to resolve a metastable state to a stable state.

Symmetric, as well as non-symmetric, boosting may improve various operating characteristics of latch circuit 100. For example, applying a boost to storage terminals 118, 120 may result in decreased time resolution constant, τ, of inverters 116 at low temperatures (e.g., <0° C.). Applying a boost to storage terminals 118, 120 may also result in decreased mean time between failures (MTBF). In other words, applying a boost to storage terminals 118, 120 may enable latch circuit 100 to operate longer, on average, before latch circuit 100 becomes metastable. Applying a boost to storage terminals 118, 120 may also enable latch circuit 100 to operate at lower operating voltages, such as when a battery or other voltage supply reduces to a fraction of maximum voltage supply level.

Boost circuit 106 may also increase the transconductance $g_m$ (and decrease the time resolution constant, τ) of inverters 116 according to various other embodiments. For example, boost circuit 106 may include one or more transistors coupled to source or inject current into storage terminals 118, 120 to increase the transconductance $g_m$ of inverters 116. According to another embodiment, boost circuit 106 may be coupled to sink current non-symmetrically, e.g., from one of terminals 118, 120, without being coupled to the other one of terminals 118, 120. Alternatively, boost circuit 106 may be coupled to source current to one of storage terminals 118, 120, without being coupled to the other one of terminals 118, 120.

Applying a boost to storage terminals 118, 120 of a latch by sourcing or sinking current increases power consumption of latch circuit 100. However, the power efficiency of latch circuit 100 may be improved by selectively enabling and disabling boost circuit 106, as opposed to maintaining boost circuit 106 in an enabled state. According to one embodiment, boost circuit 106 determines whether storage device 104 may be in a metastable state based on logical combinations (e.g., AND, NOR, NAND, etc.) of one or more of output signal OUT and output signal OUTB. According to another embodiment, boost circuit 106 determines whether storage device 104 may be in a metastable state based on logical combinations of one or more of output signal OUT, output signal OUTB, and clock signal CLK, without the determination being based on other signals. According to another embodiment, boost circuit 106 determines whether storage device 104 may be in a metastable state based on logical combinations of one or more of output signal OUT, output signal OUTB, and data signal DATA, without the determination being based on other signals. According to another embodiment, boost circuit 106 determines whether storage device 104 may be in a metastable state based on logical combinations of one or more of output signal OUT, output signal OUTB, clock signal CLK, data signal DATA, and data signal DATAB, without the determination being based on other signals. According to yet another embodiment, boost circuit 106 determines whether storage device 104 may be in a metastable state based on logical combinations of one or more of output signal OUT, output signal OUTB, clock signal CLK, data signal DATA, and data signal DATAB, inclusive of other potential input signals. As described above, boost circuit 106 may be configured to selectively inject current into or sink current from storage terminals 118, 120 in response to determining that storage circuit 104 may be in a metastable state.

Figure 2:
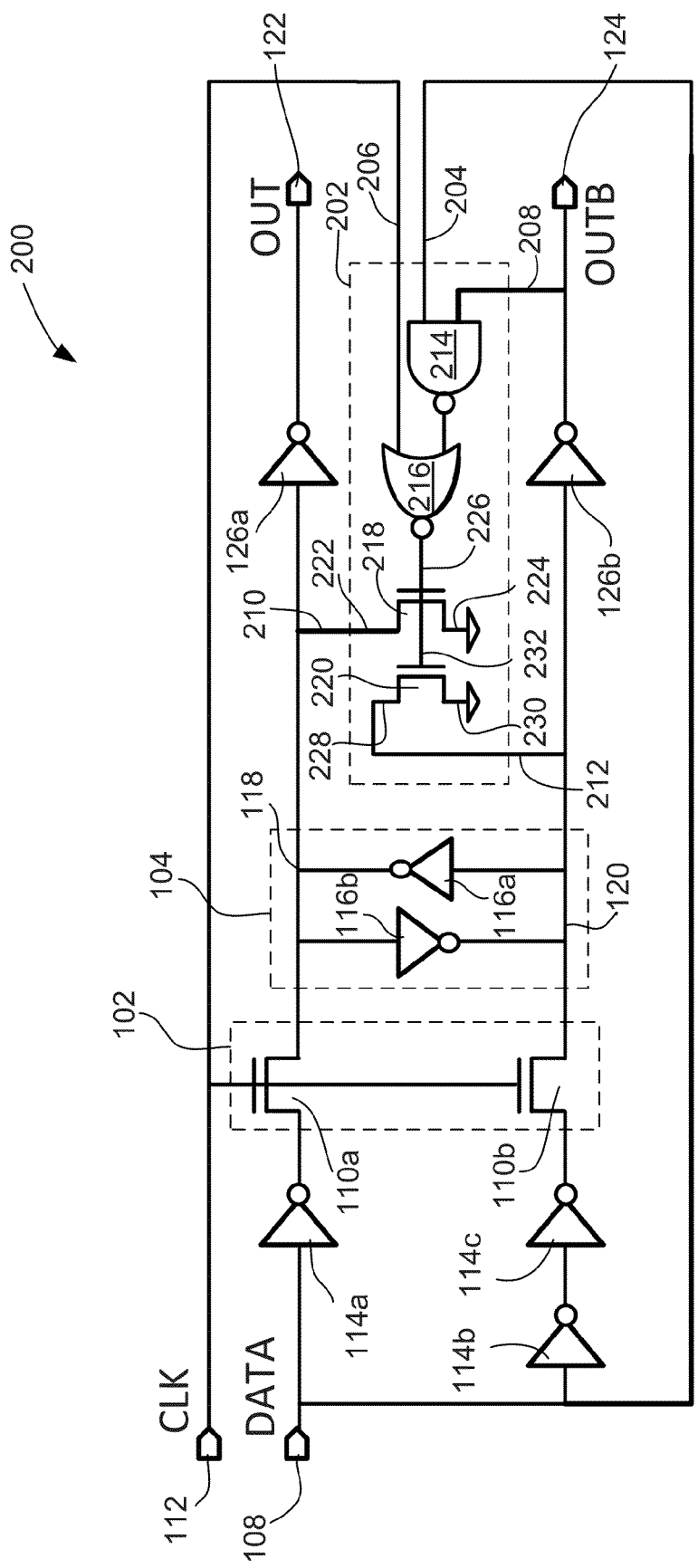
FIG. 2 is a schematic diagram of the latch with a boost circuit of FIG. 1, according to one embodiment.

FIG. 2 illustrates a latch circuit 200 configured to selectively boost storage circuit 104 with a boost circuit 202, according to one embodiment.

Boost circuit 202 may selectively boost storage circuit 104 in response to determining that storage circuit 104 may be in a metastable state or condition. For example, boost circuit 202 may determine that storage circuit 104 may be in a metastable state based on logical combinations of one or more of data signal DATA, clock signal CLK, output signal OUT, and output signal OUTB. Boost circuit 202 may include a data input terminal 204, a clock input terminal 206, and a latch feedback input terminal 208, with which to receive the corresponding signals. Boost circuit 202 may also include a first boost terminal 210 and a second boost terminal 212 that couple to storage terminal 118 and storage terminal 120, respectively.

Boost circuit 202 may determine that storage circuit 104 may be in a metastable state if data input terminal 204 is logic level HIGH and latch feedback input terminal 208 is logic level HIGH while clock input terminal 206 is logic level LOW. In response to determining that storage circuit 104 may be in a metastable state, boost circuit 202 may couple first boost terminal 210 and second boost terminal 212 to ground. Boost circuit 202 may include NAND gate 214, NOR gate 216, transistor 218, and transistor 220.

Transistor 218 may have a first conductive terminal 222 coupled to first boost terminal 210, a second conductive terminal 224 coupled to ground, and a control terminal 226. Transistor 220 may have a first conductive terminal 228 coupled to second boost terminal 212, a second conductive terminal 230 coupled to ground, and a control terminal 232. According to one embodiment, first conductive terminal 222 is connected to first boost terminal 210, and first conductive terminal 228 is connected to a second boost terminal 212. According to various embodiments, second conductive terminal 224 and second conductive terminal 230 are each coupled to a supply voltage, transistors 218, 220 are P-channel MOSFETs, and the logic elements of boost circuit 202 are configured to selectively drive transistors 218, 220 in response to various logical combinations disclosed herein. Each transistor 218, 220 may be sized such that, while conducting, each inverter 116a, 116b may source or/and sink more current than each transistor 218, 220. According to one embodiment, each transistor 218, 220 may conduct, in normal operation, less than half the current each inverter 116a, 116b may source or/and sink. According to one embodiment, each transistor 218, 220 may conduct, in normal operation, less than one-third the current each inverter 116a, 116b may source or/and sink. According to one embodiment, each transistor 218, 220 may conduct, in normal operation, less than one-quarter the current each inverter 116a, 116b may source or/and sink. According to one embodiment, normal operation refers to operating the transistors at a maximum operational current, which is a current that the transistor may conduct without damaging the device. According to another embodiment, a channel width of each transistor 218, 220 may be less than one-third of a channel width of a transistor of the same type (N-type or P-type) in each inverter 116a, 116b.

NOR gate 216 may be electrically positioned between NAND gate 214 and transistors 218 and 220. NOR gate 216 may be coupled or connected to clock input terminal 206 to receive clock signal CLK. NOR gate 216 may also be coupled to receive an output from NAND gate 214. NOR gate 216 may drive control terminal 226 and control terminal 232 to selectively couple storage terminal 118 and storage terminal 120 to ground via transistors 218 and 220, respectively.

NAND gate 214 may be coupled to drive one input of NOR gate 216. NAND gate 214 may have one input coupled to data input terminal 204 to receive data signal DATA and may have another input terminal coupled to latch feedback input terminal 208 to receive output signal OUTB. As a result, boost circuit 202 may determine that storage circuit 104 may be in a metastable state if both data signal DATA output signal OUTB are logic level LOW while clock signal CLK is logic level LOW. In other words, boost circuit 202 may determine if storage circuit 104 may be in a metastable state based on feedback from storage circuit 104.

The various digital logic components and analog devices of boost circuit 202 may be cooperatively positioned and coupled together to assist storage circuit 104 in transitioning from a metastable state to a stable state, according to various embodiments. According to one embodiment, other logic circuits may be used, such that boost circuit 202 is responsive to output signal OUT rather than responsive to output signal OUTB.

Figure 3:
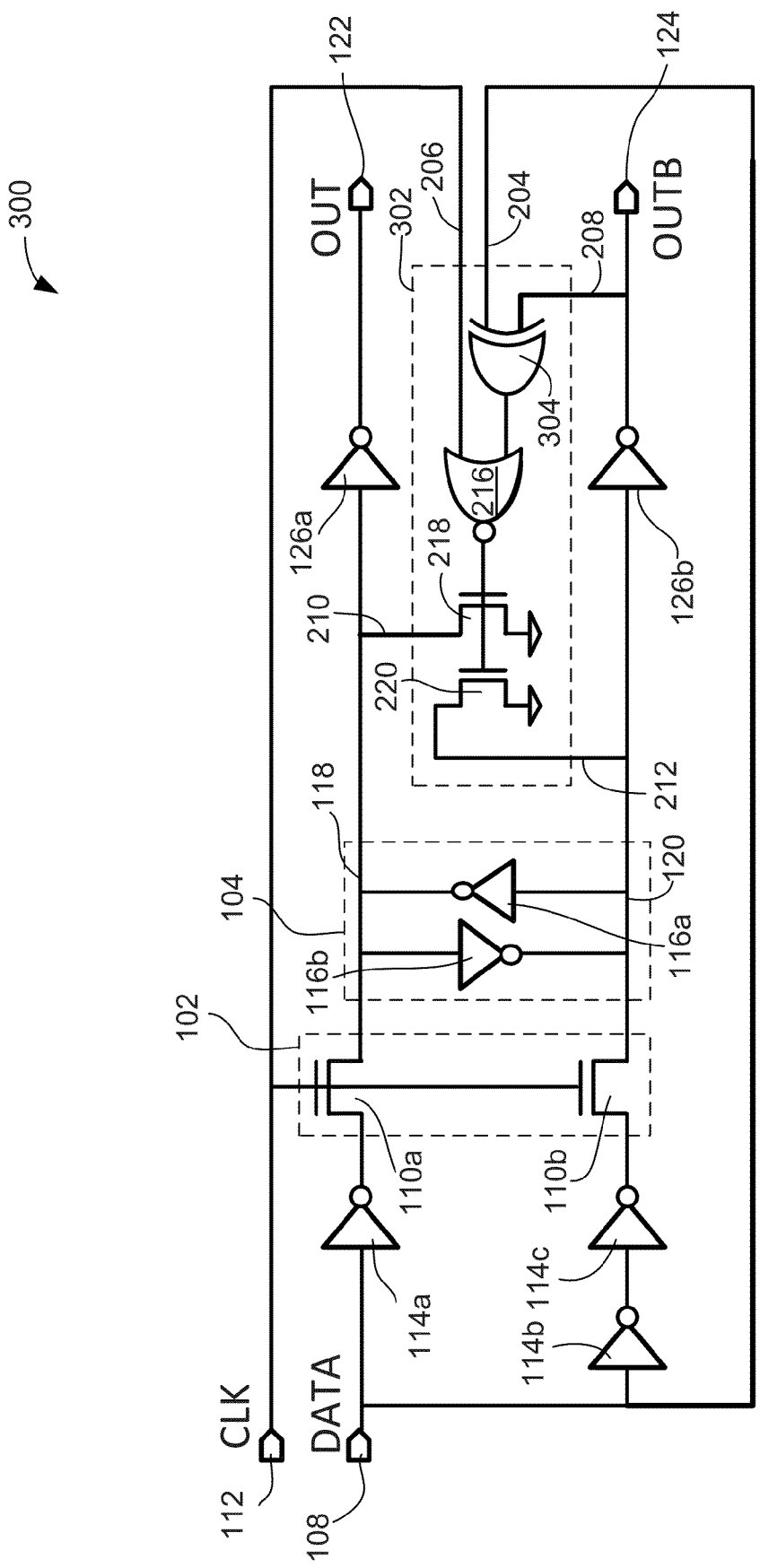
FIG. 3 is a schematic diagram of the latch with a boost circuit of FIG. 1, according to one embodiment

FIG. 3 illustrates a latch circuit 300 configured to selectively boost storage circuit 104 with a boost circuit 302, according to one embodiment.

Boost circuit 302 may determine if storage circuit 104 may be in a metastable state in response to more than one combination of inputs. According to one embodiment, boost circuit 302 may determine that storage circuit 104 may be in an metastable state if data input terminal 204 is logic level HIGH and latch feedback input terminal 208 is logic level HIGH while clock input terminal 206 is logic level LOW, similar to the function of boost circuit 202. According to one embodiment, boost circuit 302 may determine that storage circuit 104 may be in a metastable state if data input terminal 204 is logic level LOW and latch feedback input terminal 208 is logic level LOW while clock input terminal 206 is logic level LOW. In response to determining that storage circuit 104 may be in a metastable state, boost circuit 302 may couple first boost terminal 210 and second boost terminal 212 to ground. Boost circuit 302 may include various components that are similar to boost circuit 202, but boost circuit 302 may include an exclusive-OR (XOR) gate 304 in place of NAND gate 214.

XOR gate 304 may be coupled to drive one input of NOR gate 216. XOR gate 304 may have one input coupled to data input terminal 204 to receive data signal DATA and may have another input terminal coupled to receive output signal OUTB from latch feedback input terminal 208. As a result, boost circuit 302 may determine that storage circuit 104 may be in a metastable state if data signal DATA and output signal OUTB are the same logic level while clock signal CLK is logic level LOW.

Figure 4:
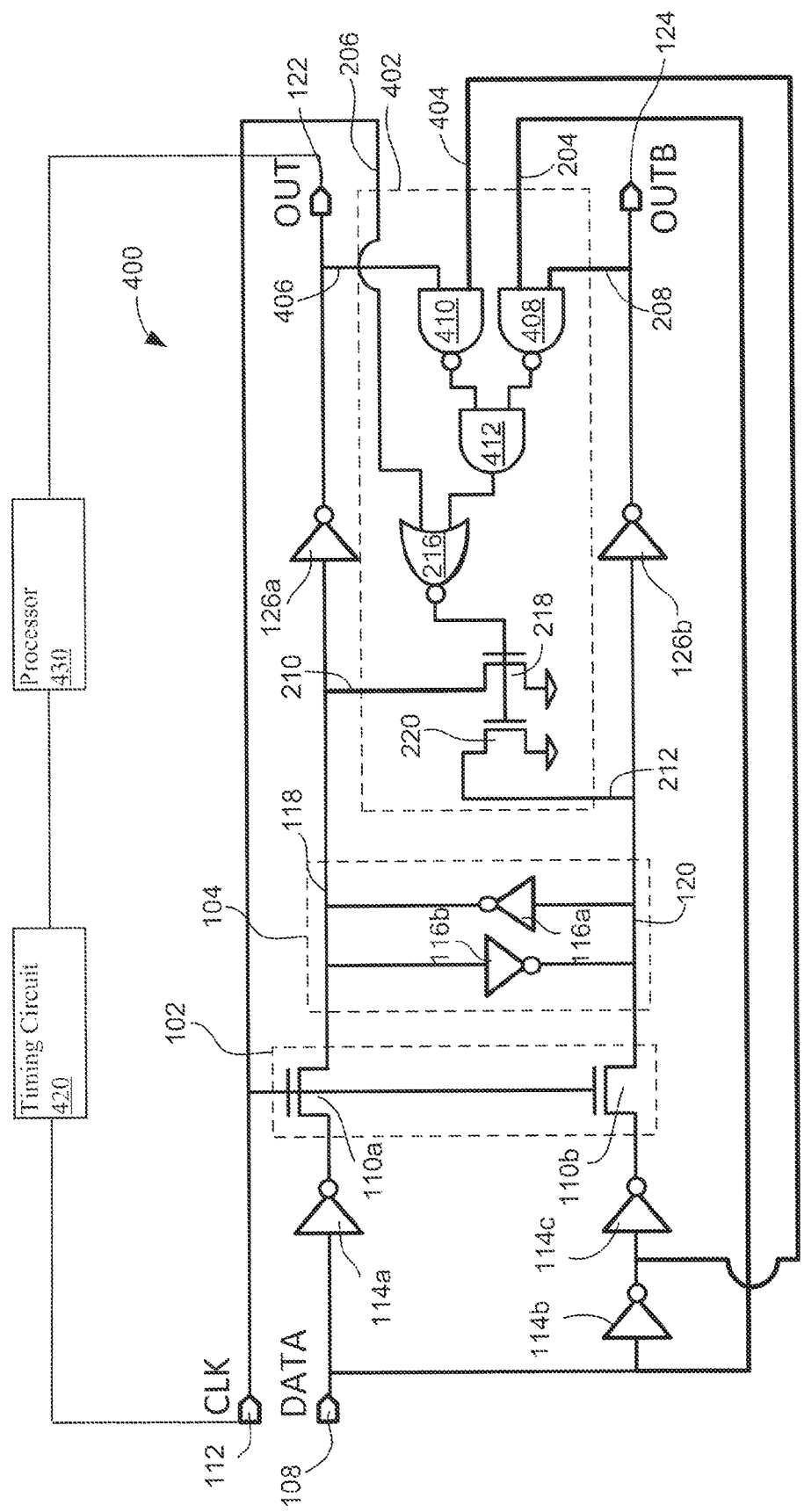
FIG. 4 is a schematic diagram of the latch with a boost circuit of FIG. 1, according to one embodiment.

FIG. 4 illustrates a latch circuit 400 configured to selectively boost storage circuit 104 with a boost circuit 402, according to one embodiment. In addition to previously discussed features, boost circuit 402 may include a data_bar input terminal 404, a latch feedback terminal 406, a NAND gate 408, a NAND gate 410, and an AND gate 412. According to one embodiment, data_bar input terminal 404 may receive a data signal DATAB that may have a logic level that is opposite to the logic level of data signal DATA.

Boost circuit 402 may monitor both output terminal 122 and output terminal 124 to determine if storage circuit 104 may be in a metastable state. According to one embodiment, boost circuit 302 may determine that storage circuit 104 may be in a metastable state if data input terminal 204 is logic level HIGH and latch feedback input terminal 208 is logic level HIGH while clock input terminal 206 is logic level LOW, similar to the function of boost circuits 202 and 302. According to another embodiment, boost circuit 402 may determine that storage circuit 104 may be in a metastable state if data_bar input terminal 404 is logic level HIGH and latch feedback input terminal 406 is logic level HIGH while clock input terminal 206 is logic level LOW. In response to determining that storage circuit 104 may be in a metastable state, boost circuit 402 may couple first boost terminal 210 and second boost terminal 212 to ground to sink current from storage terminals 118 and 120.

Boost circuit 402 may include various components that are similar to boost circuit 202 and boost circuit 302. Boost circuit 402 may include any number of additional logic circuits and/or discrete components to determine metastability according to the above described logic condition. According to one embodiment, NAND gate 410 may have input terminals coupled to data_bar input terminal 404 and latch feedback terminal 406. NAND gate 408 may have input terminals coupled to data input terminal 204 and latch feedback input terminal 208. AND gate 412 may have input terminals coupled to an output terminal of NAND gate 410 and to an output terminal of NAND gate 408. AND gate 412 may drive NOR gate 216 according to signals received from NAND gates 408, 410. As a result, boost circuit 402 may determine that storage circuit 104 may be in a metastable state if data signal DATA and output signal OUTB are concurrently logic level HIGH while clock signal CLK is logic level LOW. Boost circuit 402 may also determine that storage circuit 104 may be in a metastable state if data signal DATAB and output signal OUT are concurrently logic level HIGH while clock signal CLK is logic level LOW.

Figure 5:
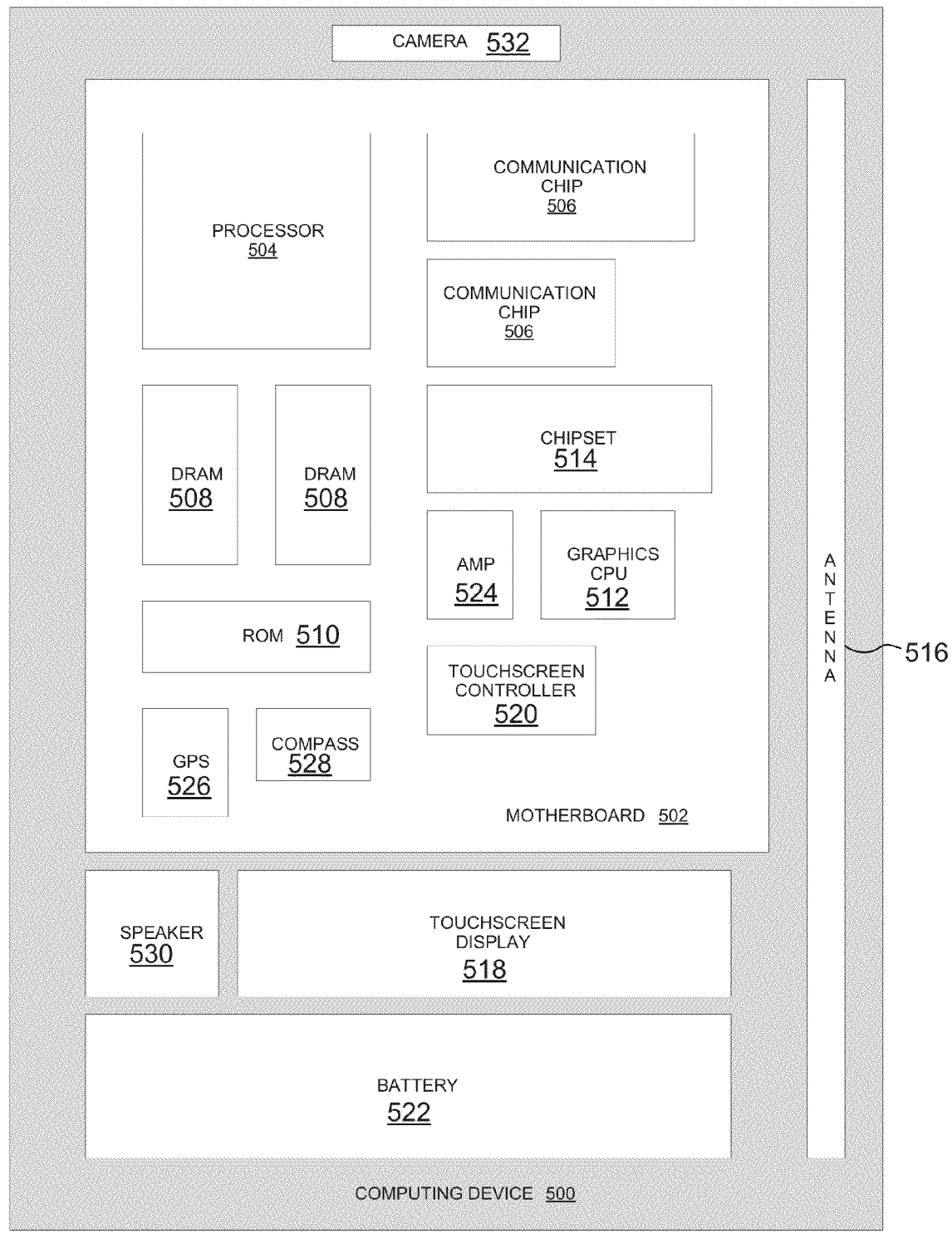
FIG. 5 is a block diagram of a computing device suitable to practice various embodiments.

FIG. 5 illustrates an example computing device 500 that may implement various embodiments of the latch circuit described herein. The computing device 500 houses a board 502. The board 502 may include a number of components, including but not limited to a processor 504 and at least one communication chip 506. The processor 504 may be physically and electrically coupled to the board 502. In some implementations at least one communication chip 506 may also be physically and electrically coupled to the board 502. In further implementations, the communication chip 506 may be part of the processor 504.

Depending on its applications, computing device 500 may include other components that may or may not be physically and electrically coupled to the board 502. These other components include, but are not limited to, volatile memory (e.g., DRAM 508), non-volatile memory (e.g., ROM 510), flash memory, a graphics processor 512, a digital signal processor, a crypto processor, a chipset 514, an antenna 516, a display, a touchscreen display 518, a touchscreen controller 520, a battery 522, an audio codec, a video codec, a power amplifier 524, a global positioning system (GPS) device 526, a compass 528, an accelerometer, a gyroscope, a speaker 530, a camera 532, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the disclosure, the integrated circuit die of the communication chip includes one or more devices, configured to communicate with external devices and/or systems.

In further implementations, another component housed within the computing device 500 may contain an integrated circuit die that includes one or more devices, such as processor cores, cache and one or more memory controllers.

According to various embodiments, any or each of the components described in computing device 500 may include one or more of latches 100, 200, 300, and 400. For example, one or more of latches 100, 200, 300, and 400 may be used in any one or more of motherboard 502, processor 504, communication chip 506, DRAM 508, ROM 510, graphics CPU 512, chipset 514, touch screen display 518, touch screen controller 520, amp 524, GPS 526, compass 528, speaker 530, and camera 532.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration, connection, and operation of certain elements in various embodiments may have been described above in the context of high/low values of signals, responses to rising/falling edges of signals, inverters to invert signals, P-type and N-type transistors, and so forth. In other embodiments, different configurations can be provided in view of whether N-type transistors are used instead of P-type transistors, whether or not certain signals are inverted, whether certain changes in state are triggered in response to falling edges instead of rising edges or vice versa, and so forth.

Various example embodiments will hereafter be disclosed.

According to various example embodiments, a latch circuit may include a storage circuit having a first terminal and a second terminal and including two cross-coupled inverters, and a feedback circuit coupled to the first terminal. The feedback circuit may include electronic logic elements to determine if the storage circuit is in a metastable state. The feedback circuit may be configured to couple at least one of the first and second terminals to one of a voltage reference and voltage source to resolve the storage circuit to a state different from the metastable state.

In embodiments, the feedback circuit may determine whether the storage circuit is in the metastable state if a control terminal is logic level LOW.

In embodiments, the control terminal may include a clock terminal.

In embodiments, the latch circuit may further include an output terminal, an output_bar terminal to provide a logic level that is opposite a logic level of the output terminal, and an input data terminal. The feedback circuit may determine that the storage circuit is in the metastable state if the output_bar terminal is logic level HIGH and the input data terminal is logic level HIGH.

In embodiments, the latch circuit may include an output terminal, an output_bar terminal to provide a logic level that is opposite a logic level of the output terminal, and an input data terminal. The feedback circuit may determine whether the storage circuit is in the metastable state if the output_bar terminal is logic level LOW and the input data terminal is logic level LOW.

In embodiments, the feedback circuit couples at least one of the first terminal and the second terminal to one of the voltage reference and the voltage source with at least one transistor, wherein the at least one transistor is operable to conduct a maximum operational current that is less than half of a maximum operational current of either one of the two cross-coupled inverters.

According to various embodiments, an apparatus may include a clock-based storage circuit to store a first voltage level, an output terminal, coupled to the storage circuit, to provide an output voltage level, and a feedback circuit coupled to the output terminal to receive the output voltage level and coupled to the storage circuit to cause the first voltage level to resolve to a first state or to a second state, in response to at least the received output voltage level.

In embodiments, the first voltage level may be at a metastable level, and the first voltage level may be resolved from the metastable level to the first state that is of an opposite logical level than the second state.

In embodiments, the first voltage level may be at a metastable level, and the first voltage level may be resolved from the metastable level to a second state that is of an opposite logical level than the first state.

In embodiments, to resolving in response to at least the received output voltage level may include resolving in response to a combination of the received output voltage level, a clock signal, and a data signal from which the first voltage level originated.

In embodiments, the feedback circuit may couple the storage circuit to one of a voltage reference and a voltage source if the output voltage level is same as the input data voltage level.

In embodiments, the apparatus may further include an inverter coupled to the output terminal to invert a logic level of the output voltage level before the output terminal provides the output voltage level.

In embodiments, the feedback circuit may couple the storage circuit to one of a voltage reference and a voltage source if the output voltage level and an input data voltage level are logic level LOW.

In embodiments, the storage circuit may include cross-coupled inverters and the feedback circuit may be configured to selectively couple terminals of the cross-coupled inverters to ground to reduce a resolution time of the storage circuit.

In various example embodiments a system may include a timing circuit to generate a clock signal, a processor coupled to the timing circuit to receive the clock signal, and a latch circuit coupled to the timing circuit to receive the clock signal. The latch circuit may be coupled to the processor to provide a data signal based on the clock signal. The latch circuit may include a storage circuit having a first terminal and a second terminal and including two cross-coupled inverters, and a feedback circuit coupled to the first terminal. The feedback circuit may include electronic logic elements to determine if the storage circuit is in a metastable state. The feedback circuit may be configured to couple at least one of the first and second terminals to one of a voltage reference and voltage source to resolve the storage circuit to a state different from the metastable state.

In embodiments, the latch circuit may further include an output terminal, an output bar terminal to provide a logic level that is opposite a logic level of the output terminal, and an input data terminal. The feedback circuit may determine that the storage circuit is in the metastable state if an output_bar terminal is logic level HIGH and a input data terminal is logic level HIGH.

In embodiments, the feedback circuit may determine that the storage circuit is in the metastable state while the clock signal is logic level LOW.

In embodiments, the feedback chip may sense a first output terminal of the latch circuit and a second output terminal of the latch circuit to determine if the storage circuit is in the metastable state.

In embodiments, the latch circuit may be coupled to the processor to synchronize the data signal to the clock signal for use by the processor.

In embodiments, the latch circuit may be a first latch circuit having an output terminal to provide the data signal based on the clock. The system on a chip may further include a second latch circuit to receive the data signal and synchronize the data signal to an inverted version of the clock. The second latch circuit may include a clock terminal configured to receive and invert a logic level of the clock, and an input terminal coupled to the output terminal of the first latch circuit to receive the data signal. The second latch circuit may include a second storage circuit having a third terminal and a fourth terminal and including two cross-coupled inverters, and a second feedback circuit coupled to the third terminal. The feedback circuit may include electronic logic elements configured to determine if the second storage circuit is in a metastable state. The second feedback circuit may be configured to couple at least one of the third and fourth terminals to one of a voltage reference and voltage source to resolve the second storage circuit to a state different from the metastable state.

In embodiments, the first latch circuit and the second latch circuit may form a multi-stage synchronizer.

In various example embodiments, a method may include sensing an output of a latch circuit, and determining that the latch circuit is in a metastable state based on a comparison of the sensed output of the latch circuit and a data input of the latch circuit. The method may include coupling one or more nodes of the latch circuit to a particular voltage level to cause the latch circuit to resolve to a stable state, in response to determining that the latch circuit is in the metastable state.

In embodiments, determining may include determining while an input clock of the latch circuit is logic level LOW.

In embodiments, determining may include determining that the latch circuit is in the metastable state if the output of the latch circuit is logic level HIGH and the data input is logic level LOW.

Each of the embodiments discussed above may be fully or partially combined with all or part of each other embodiment disclosed above in order to produce additional embodiments.

These and other modifications can be made in light of the above detailed description. The terms used in the following claims should not be construed to be limited to the specific embodiments disclosed in the specification.

What is claimed is:

1. A latch circuit, comprising:
   a storage circuit having a first terminal and a second terminal and including two cross-coupled inverters;
   an input data terminal coupled to the storage circuit;
   a control terminal coupled to the storage circuit;
   an output terminal and an output_bar terminal coupled to the storage circuit, wherein the output_bar terminal provides a logic level that is opposite a logic level of the output terminal; and
   a feedback circuit coupled to the storage circuit, the feedback circuit including electronic logic elements to determine if the storage circuit is in a metastable state based on logical levels of the control terminal, the input data terminal, and the output_bar terminal, the feedback circuit to couple at least one of the first and second terminals to one of a voltage reference and voltage source to resolve the storage circuit to a state different from the metastable state.

2. The latch circuit of claim 1, wherein the control terminal includes a clock terminal.

3. The latch circuit of claim 1,
   wherein the feedback circuit determines that the storage circuit is in the metastable state if the control terminal is logic level LOW, the output_bar terminal is logic level HIGH and the input data terminal is logic level HIGH.

4. The latch circuit of claim 1, further including:
   wherein the feedback circuit determines whether the storage circuit is in the metastable state if the output_bar terminal is logic level LOW and the input data terminal is logic level LOW.

5. The latch circuit of claim 1, wherein the feedback circuit couples at least one of the first terminal and the second terminal to one of the voltage reference and the voltage source with at least one transistor, wherein the at least one transistor is operable to conduct a maximum operational current that is less than half of a maximum operational current of either one of the two cross-coupled inverters.

6. An apparatus, comprising:
   a clock-based storage circuit to store a first voltage level;
   an output terminal, coupled to the storage circuit, to provide an output voltage level; and
   a feedback circuit coupled to the output terminal to receive the output voltage level and coupled to the storage circuit to cause the first voltage level to resolve to a first state or to a second state, in response to a combination of:
   the output voltage level;
   a clock signal; and
   a data signal from which the first voltage level originated.

7. The apparatus of claim 6, further comprising:
wherein the first voltage level is at a metastable level, and wherein the first voltage level is resolved from the metastable level to the first state that is of an opposite logical level than the second state.

8. The apparatus of claim 6, wherein the first voltage level is at a metastable level, and wherein the first voltage level is resolved from the metastable level to a second state that is of an opposite logical level than the first state.

9. The apparatus of claim 6, wherein the feedback circuit couples the storage circuit to one of a voltage reference and a voltage source if the output voltage level is same as an input voltage level of the data signal.

10. The apparatus of claim 9, further including an inverter coupled to the output terminal to invert a logic level of the first voltage level before the output terminal provides the output voltage level.

11. The apparatus of claim 6, wherein the feedback circuit couples the storage circuit to one of a voltage reference and a voltage source if the output voltage level and an input data voltage level are logic level LOW.

12. The apparatus of claim 6, wherein the storage circuit includes cross-coupled inverters and the feedback circuit is configured to selectively couple terminals of the cross-coupled inverters to ground to reduce a resolution time of the storage circuit.

13. A system, comprising:
a timing circuit to generate a clock signal;
a processor coupled to the timing circuit to receive the clock signal; and
a latch circuit coupled to the timing circuit to receive the clock signal, and coupled to the processor to provide a data signal based on the clock signal, the latch circuit including:
  a storage circuit having a first terminal and a second terminal and including two cross-coupled inverters;
  an input data terminal coupled to the storage circuit;
  an output terminal and an output_bar terminal coupled to the storage circuit, wherein the output_bar terminal provides a logic level that is opposite a logic level of the output terminal; and
  a feedback circuit coupled to the first terminal, the feedback circuit including electronic logic elements to determine if the storage circuit is in a metastable state based at least in part on logical levels of the input data terminal and the output_bar terminal, the feedback circuit to couple at least one of the first and second terminals to one of a voltage reference and voltage source to resolve the storage circuit to a state different from the metastable state.

14. The system on a chip of claim 13,
wherein the feedback circuit determines that the storage circuit is in the metastable state if the output_bar terminal is logic level HIGH and the input data terminal is logic level HIGH.

15. The system on a chip of claim 14, wherein the feedback circuit determines that the storage circuit is in the metastable state while the clock signal is logic level LOW.

16. The system on a chip of claim 13, wherein the feedback circuit senses the output terminal of the latch circuit and the output bar terminal of the latch circuit to determine if the storage circuit is in the metastable state.

17. The system on a chip of claim 13, wherein the latch circuit is coupled to the processor to synchronize the data signal to the clock signal for use by the processor.

18. A method, comprising:
sensing an output of a latch circuit;
determining that the latch circuit is in a metastable state based on a comparison of the output of the latch circuit and a data input of the latch circuit, wherein determining includes determining that the latch circuit is in the metastable state if the output of the latch circuit is logic level HIGH and the data input is logic level LOW; and
coupling one or more nodes of the latch circuit to a particular voltage level to cause the latch circuit to resolve to a stable state, in response to determining that the latch circuit is in the metastable state.

19. The method of claim 18, wherein determining includes determining while an input clock of the latch circuit is logic level LOW.

* * * * *